(12) United States Patent
Chien

(10) Patent No.: US 6,672,882 B2
(45) Date of Patent: Jan. 6, 2004

(54) SOCKET STRUCTURE FOR GRID ARRAY (GA) PACKAGES

(75) Inventor: Ray Chien, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/036,399

(22) Filed: Jan. 7, 2002

(65) Prior Publication Data

US 2002/0090843 A1 Jul. 11, 2002

(30) Foreign Application Priority Data

Jan. 11, 2001 (TW) .......................... 90100655 A

(51) Int. Cl.[7] .............................................. H01R 12/00
(52) U.S. Cl. ............................ 439/71; 439/66; 439/83; 439/382; 439/487; 439/67
(58) Field of Search .............................. 439/71, 73, 67, 439/83, 66, 487, 382, 383, 384

(56) References Cited

U.S. PATENT DOCUMENTS 4,677,458 A * 6/1987 Morris ........................ 257/696
5,460,538 A * 10/1995 Ikeya .......................... 439/331
5,479,110 A * 12/1995 Crane et al. ................. 324/757
5,936,849 A * 8/1999 Fetterman .................... 361/783
6,102,710 A * 8/2000 Beilin et al. ................... 439/67

* cited by examiner

Primary Examiner—Truc Nguyen
(74) Attorney, Agent, or Firm—Rabin & Berdo, P.C.

(57) ABSTRACT

A socket structure for grid array (GA) packages, mainly comprises the flexible chassis assembly, the frame, the first hinge cover lid and the second hinge cover lid. The flexible chassis assembly comprises the silicon rubber pad, the inner base plate, the flex-board, two solder mask layers, bumps and solder balls. The flex-board, encompassing the silicon rubber pad and the inner base plate, is used for electrical contacts. By pressing the first hinge cover lid and the second hinge cover lid downward, the hinge pads thereon contact with the substrate of the package and snap the package firm in place. In this invention, the package with pre-attached heat sink can be easily placed into the socket.

24 Claims, 10 Drawing Sheets

SOCKET STRUCTURE FOR GRID ARRAY (GA) PACKAGES

This application incorporates by reference Taiwanese application Ser. No. 89125656, Filed Jan. 11, 2001.

BACKGROUND OF THE INVENTION

1. Field of the Invention

The invention relates in general to a socket structure, and more particularly to a socket structure for Grid Array (GA) packages.

2. Description of the Related Art

In the development of IC packaging technology, the integrated circuit (IC) packages in Grid Array (GA) forms, such as Ball Grid Array (BGA), Flip Chip BGA and Land Grid Array (LGA) packages, have been evaluated as an important packaging type due to its great developing potential. The IC devices can be packaged by a variety of the exterior packaging materials, so that the IC device can be easily mounted on the printed circuit board (PCB) and the functions of IC signal transmission and heat dissipation are also achieved. In assembling the IC and PCB, the conventional method of pin through hole (PTH) is mostly replaced by the surface mount technology (SMT), in order to increase the assembly efficiency and density of the IC package. The PTH method means that the insertion of component leads into via holes for connecting and soldering the IC to the PCB. The SMT style means that the IC is soldered onto the PCB at high temperature without any insertion of component leads.

In order to increase the density of the IC package, the Area Array Package has gradually replaced the Peripheral Lead Package. This change indicates that the main goal is to develop low cost packages and higher package density and larger pin counts, so as to enhance the packaging yield. Accordingly, the Quad Flat Package (QFP) is replaced by the BGA and LGA, and the Tape Carrier Package (TCP) is replaced by the Flip Chip Package.

FIG. 1A depicts the cross-sectional drawing of a conventional two-layer flip-chip LGA. The package 100 includes the IC 102 and the substrate 104. The top surface of the IC 102, which has the IC I/O pads, faces downward for the purpose of electrically connecting the IC I/O pads to the substrate 104 by the solder bump 106. The periphery of the solder bumps 106 is further filled with the gel to form the underfill 107 for the purpose of mechanically protecting electrical connection between the IC I/O pads and the solder bump 106. The substrate 104 further includes the first solder mask 108, the second solder mask 110 and the vias 112. The IC 102 is attached on the first solder mask 108, while the Ni/Au plated contact land pads 114 form an array in the opening portion of the second solder mask 110, as the name LGA (Land Grid Array) implies. A LGA package with (solder) bump pads (not shown) on the substrate 104 for the purpose of flip-chip die attachment is called a flip-chip LGA package. A flip-chip LGA substrate can have a two-layer (2 L) or multi-layer structure depending on the design requirement and available manufacturing capability. If the solder balls (not shown in FIG. 1A) are further attached on the Ni/Au plated contact land pads 114 in FIG. 1, the package 100 becomes BGA (Ball Grid Array) style. Simply stated, a flip-chip LGA package is essentially identical to a commonly seen flip-chip BGA package with the solder balls removed. Additionally, the vias 112 are between the first solder mask 108 and the second solder mask 110 to electrically connect the solder bumps 106 and the Ni/Au plated contact land pads 114.

FIG. 1B depicts the cross-sectional drawing of a conventional two-layer wire-bond LGA. The package 120 comprises the IC 122 and the substrate 124. The bottom surface of the IC 122, without IC I/O pads, adheres to the substrate 124 by the silver epoxy 126. The substrate 124 further includes the first solder mask 128, the second solder mask 130, and the vias 132. The IC 122 is attached on the first solder mask 128, and the IC I/O pad of the IC die 122 is electrically connected to the substrate 124 by a wire bond method. For example, the opening area on the top side of the first solder mask 128, which is electroplated with Ni/Au and called a bonding finger, is connected to the IC I/O pad by the gold wire 133 for transmitting the electrical signal of IC 122 to the substrate 124. As the name wire-bond LGA (Land Grid Array) implies, the Ni/Au plated contact land pads 134 are attached to the opening portion of the bottom side of the second solder mask 130 and orderly form an array. If the solder balls (not shown in FIG. 1B) are further attached on the Ni/Au plated contact land pads 134 of the second solder mask 130, the package 120 becomes wire-bond BGA (Ball Grid Array) package. Therefore, a wire-bond LGA package is essentially identical to a commonly seen wire-bond BGA package with the solder balls removed. Also, the vias 132 between the first solder mask 128 and the second solder mask 130 to connect the gold wire 133 and the Ni/Au plated contact land pads 134, are the bridge of the electrical signal transmission. Additionally, the molding compound 136 is formed above the first solder mask 128 and encapsulates the IC die 122 for the purpose of protecting the wire bonded IC. The molding compound 136 prevents the wire bonded IC from corrosion and reduce the chance of IC destruction.

In order to mounting the package on the PCB, a socket is usually employed as an intermediate. The socket is usually mounted on the PCB by the PTH (pin through holes) method, and then the package is situated inside the socket. The drawback is that the socket rigidly soldered to the PCB by the leads is not easily removed or replaced when the socket is broken.

Some of the sockets are categorized as test sockets. A technique related to the test socket is disclosed in U.S. Pat. No. 5,290,193, "High density grid array test socket", Goff, et al. FIG. 2 depicts the cross-sectional drawing of the conventional test socket. The test socket 200 comprises the extension spring with the snap latches 202a and 202b, the pogo pins assemblies 204a and 204b. If the package 206 is pushed downward, the extension spring with the snap latches 202a and 202b are compressed and moved toward the left and the right side, respectively, to facilitate the electrical contact of the package 206 and the test socket 200. After the package 206 is completely pressed down into the test socket 200, the compressed snap latches 202a and 202b return to the original position and hold down the package 206. The force balance of the snap latches 202a, 202b and the pogo pins assemblies 204a, 204b allows the package 206 to rest in the test socket 200. However, the cost of this test socket is considerably high.

FIG. 3A depicts the 3-dimentional drawing of another conventional socket for mounting on the PCB. Also, refer to FIG. 1A. In FIG. 3A, the socket 320 mounted on the PCB 321 comprises the socket base 322 and the socket lid 324. The socket base 322 has an open area 326 for aligning the package 100. The hinge 328, jointing the socket lid 324 and the socket base 322, allows pivoting of the socket lid 324 on the socket base 322. The socket lid 324 also has an open area 329 corresponding to the open area 326 of the socket base 322. After the IC package 100 is seated within the open area 326, the socket base 322 is covered with the socket lid 324 and fixed by the latching mechanism. For example, when the socket base 322 is covered with the socket lid 324, the first fixing piece 330a and the second fixing piece 330b on the edge of the socket lid 324 are engaged with the first fixing clasp 332a and the second fixing clasp 332b. Additionally, the contacts (not shown in FIG. 3A) formed of a conductive material such as gold plated phosphor-bronze are arranged around the open area 326 and extend transversely through the socket base 322. When the socket 320 is mounted on the PCB 321, the contacts operate to electrically couple the socket base 322 and the IC package 100 to the underlying PCB 321.

Generally, the heat sink (not shown in FIG. 3A) is further attached to the package 100 through the open area 329 for providing effective heat dissipation. In some cases, however, the heat sink directly attaches to the package before the package is aligned in the socket 326. FIG. 3B shows the package with the pre-attached heat sink. Usually, the size of the heat sink 342 is beyond the boundary of the open area 329. When the package 340 with the pre-attached heat sink 342, as shown in FIG. 3B, is seated in the open area 329 of the socket 320, it is very difficult or impossible to close the socket lid 324 due to the large heat sink 342.

The aforementioned sockets have the drawbacks including:

(1) Spring contacts or similar device, such as pogo pins are needed, which may incur the higher production cost of the socket.

(2) For most prior arts, the heat slug or heat sink is larger than the opening area of the socket and the socket base can't be covered by the hinged socket lid. Therefore, it is impossible to mount an IC package with a pre-attached heat slug or heat sink into the socket.

(3) The sockets are usually not easily removed and replaced if the socket is soldered on the PCB by PTH (pin through hole) method.

SUMMARY OF THE INVENTION

It is therefore an objective of this invention to provide a socket structure for grid array (GA) packages. The conventional expansive spring contacts such as pogo pins can be replaced by the flexible chassis assembly of the invention, and the primary cost is therefore decreased. Also, the socket of the invention can host the package with pre-attached heat sink. Besides, the socket mounted on the PCB by SMT method is easily removed and replaced if broken.

The invention achieves the above-identified objectives by providing a socket structure for grid array (GA) packages, which is to be mounted on a printed circuit board (PCB) for receiving a package. The socket structure includes the frame and the flexible chassis assembly. The flexible chassis assembly, situated inside the frame for electrically connecting the package and the PCB, comprises the silicone rubber pad, the inner base plate, the flex-board, two solder mask layers, bumps and solder balls. The inner base plate is beneath and supportive for the silicone rubber pad, and the flex-board encompass the silicone rubber pad and the inner base plate. Two solder mask layers are formed on a surface of the flex-board and have a interconnect layer thereunder. Numerous bumps, formed on the topside of the flexible chassis assembly, are electrically connected to the package. Numerous solder balls, formed on the bottom side of the flexible chassis assembly, are electrically connected to the PCB.

Another objectives of the invention are achieved by providing the socket structure for grid array (GA) packages, which is to be mounted on a printed circuit board (PCB) for receiving a package. The socket structure includes the frame, the first hinge cover lid and the second hinge cover lid. The first hinge cover lid is situated and is for pivoting on the frame by the first hinge pin and the second hinge pin. The second hinge cover lid is situated for pivoting on the frame by the third hinge pin and the fourth hinge pin. Through the closing action of the hinge cover lids onto the package, the package can be well fixed in the socket.

BRIEF DESCRIPTION OF THE DRAWINGS

Other objectives, features, and advantages of the invention will become apparent from the following detailed description for the preferred but non-limiting embodiment. The description is made with reference to the accompanying drawings in which.

DESCRIPTION OF THE PREFERRED EMBODIMENT

Figure 1A:
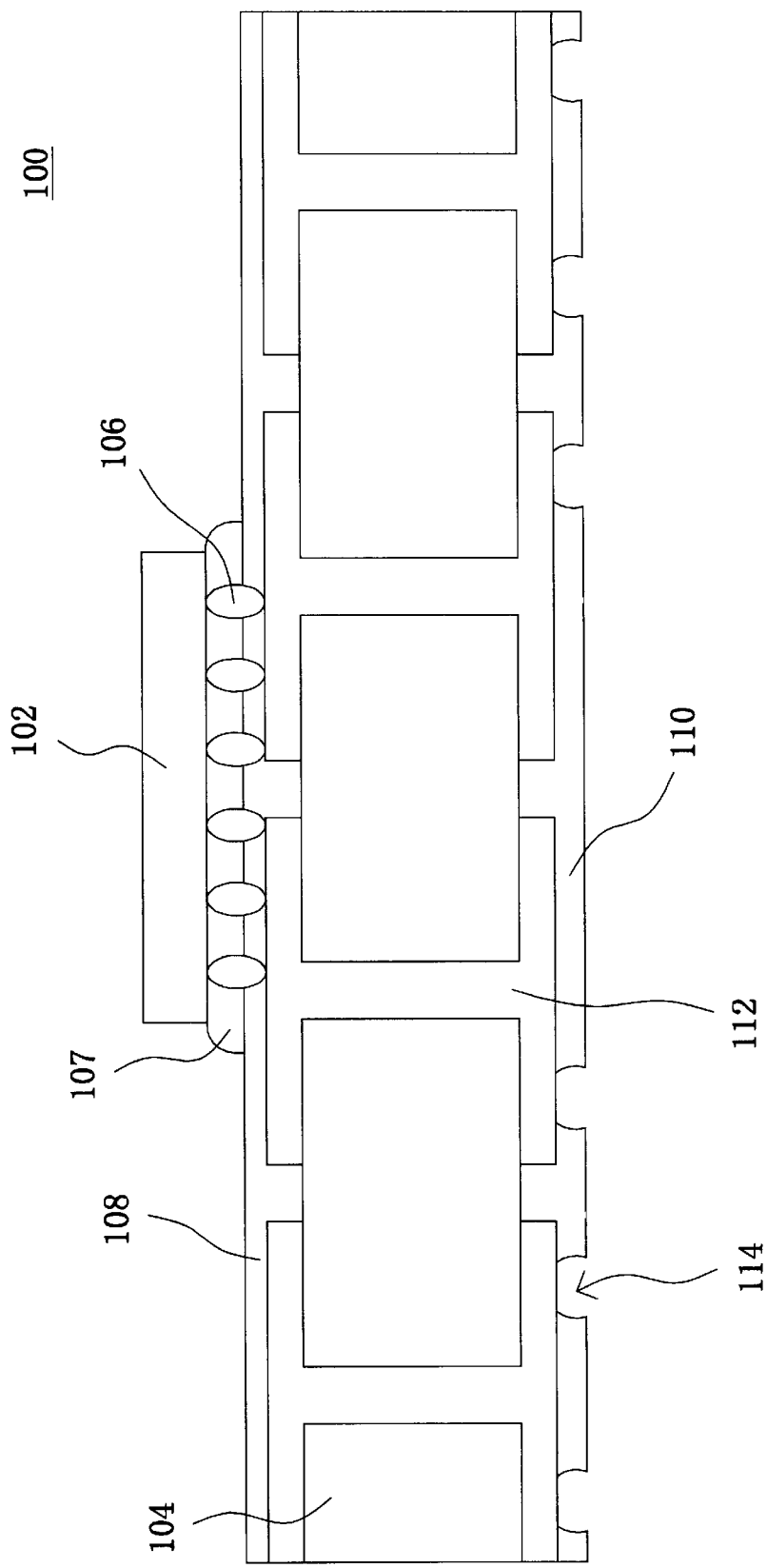
FIG. 1A (prior art) depicts the cross-sectional drawing of a conventional two-layer flip-chip LGA.
Figure 1B:
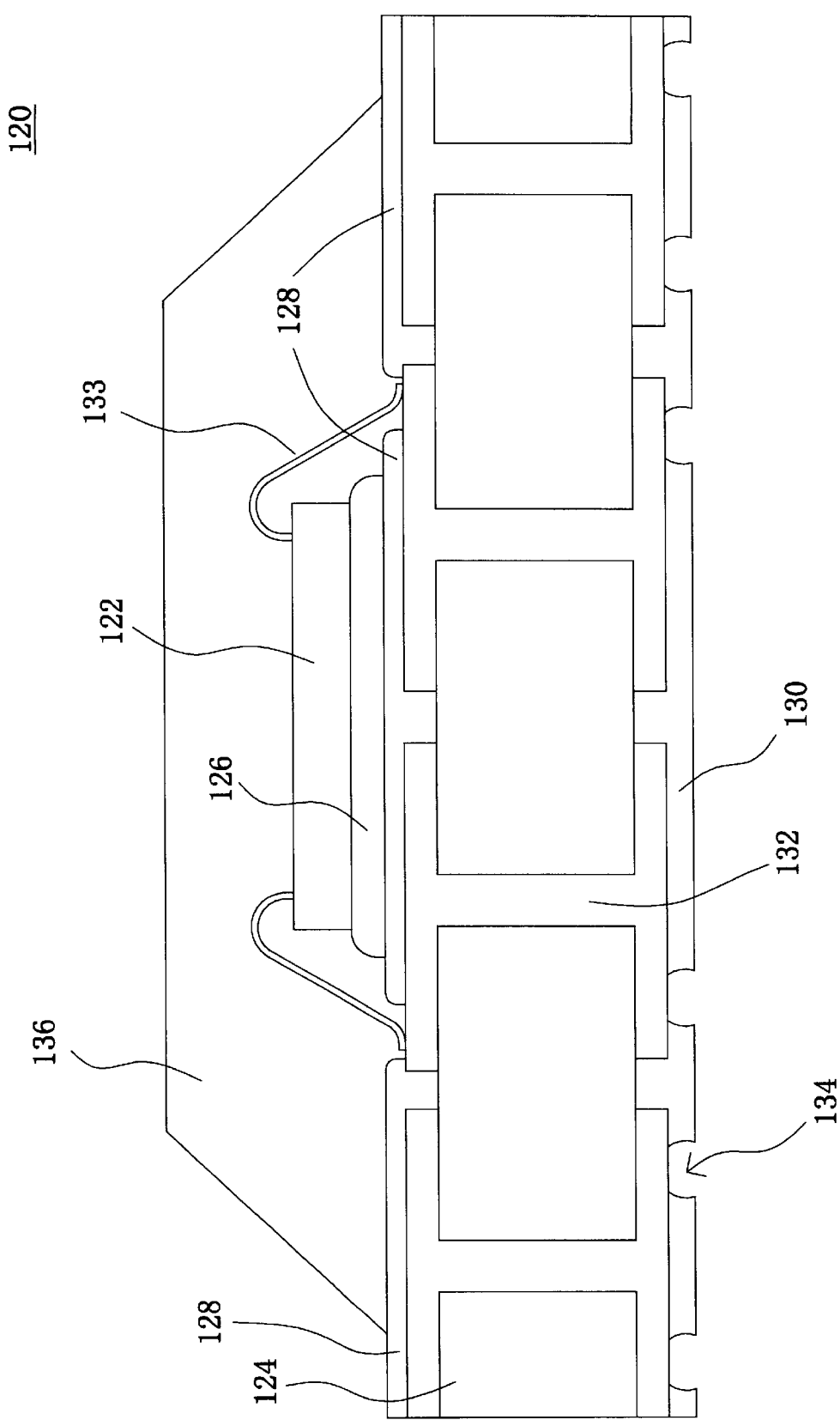
FIG. 1B (prior art) depicts the cross-sectional drawing of a conventional two-layer wire-bond LGA.
Figure 2:
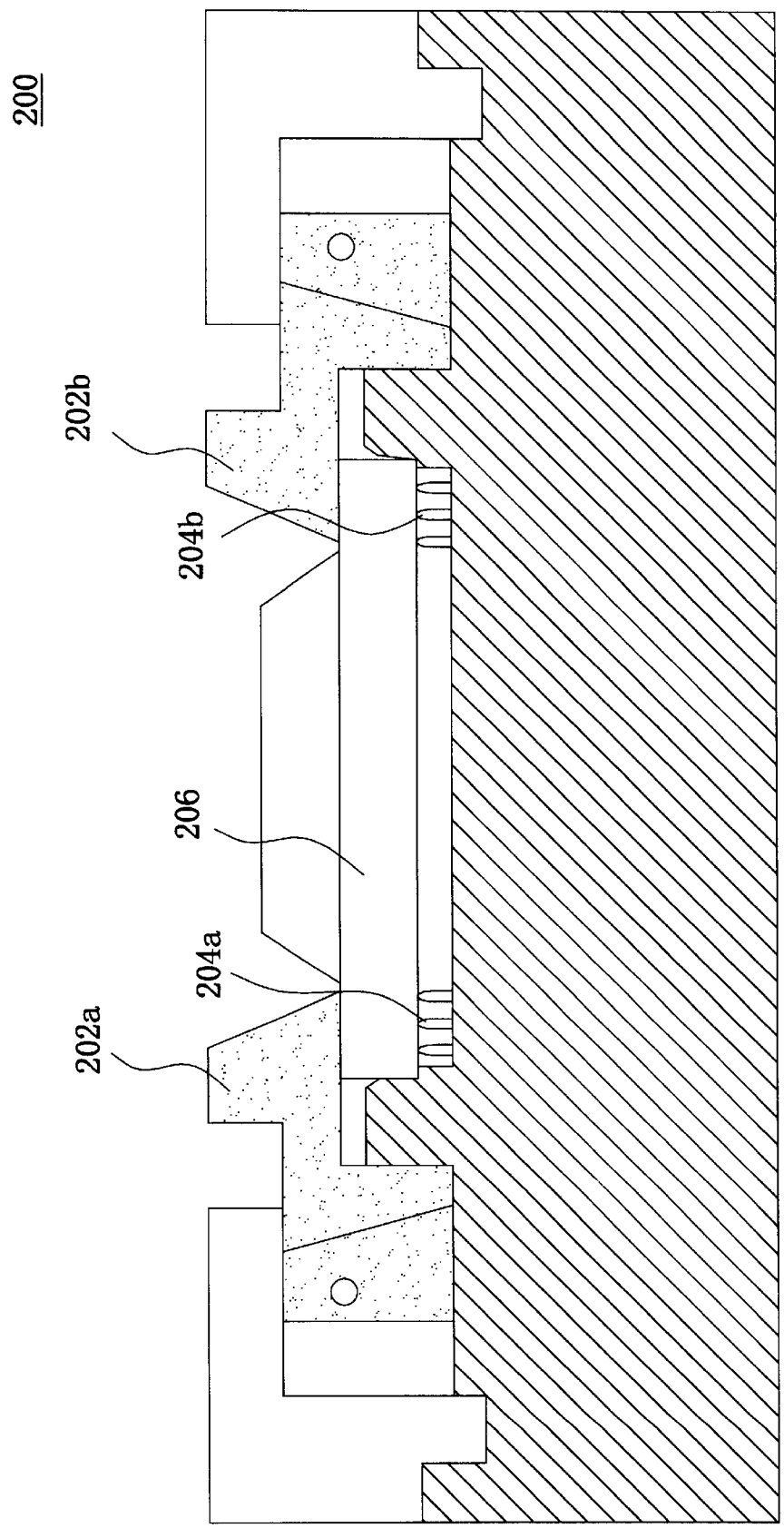
FIG. 2 (prior art) depicts the cross-sectional drawing of the conventional test socket.
Figure 3A:
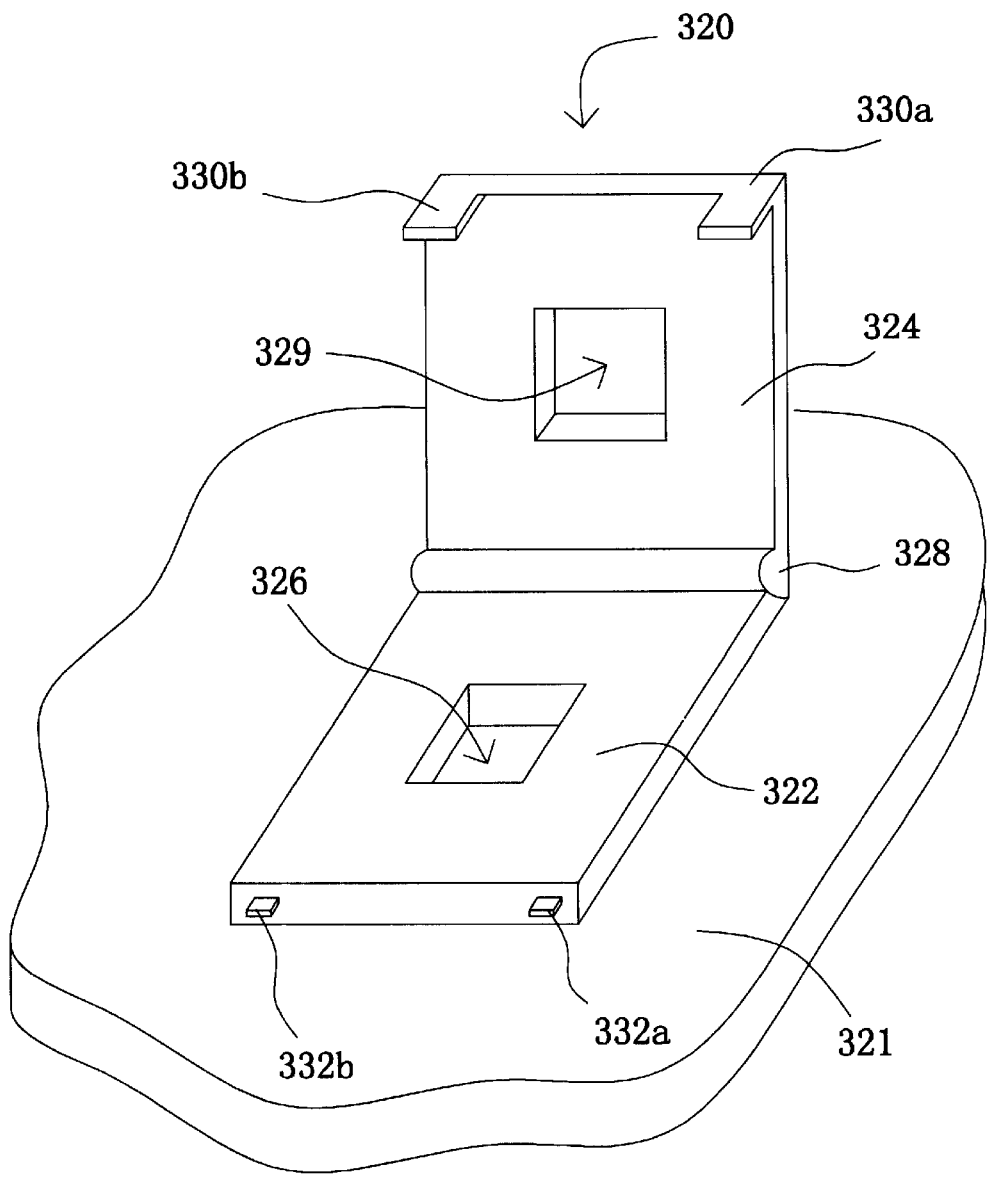
FIG. 3A (prior art) depicts the 3-dimentional (perspective) drawing of another conventional socket for mounting on the PCB.
Figure 3B:
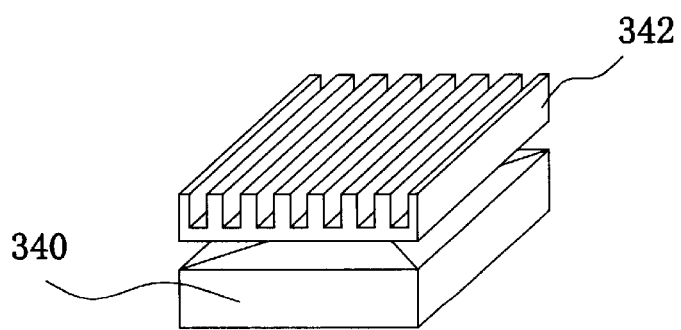
FIG. 3B (prior art) shows the package with the pre-attached heat sink.
Figure 4:
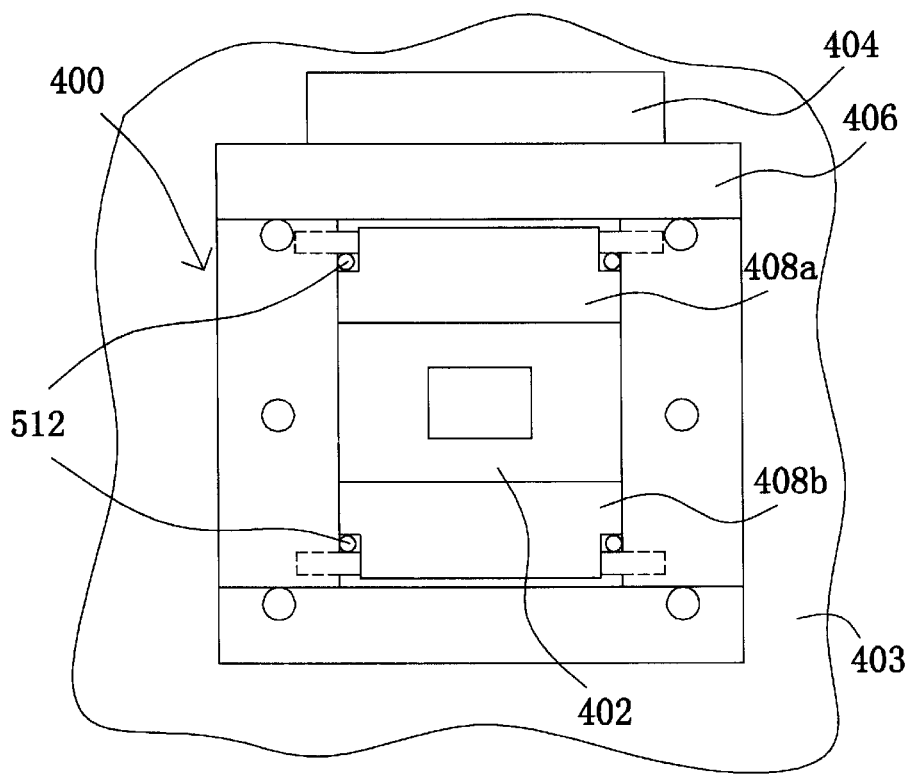
FIG. 4 is a top view of the socket mounted on the printed circuit board (PCB) for aligning the grid array (GA) package according to the invention.

FIG. 4 is a top view of the socket mounted on the printed circuit board (PCB) for aligning the grid array (GA) package according to the invention. In the following description, specific details that the socket 400 mounted on the PCB 403 for carrying the package 402 are set forth, and the package 402 formed by the Land Grid Array (LGA) style is illustrated. However, it will be understood by anyone skilled in the art the invention is not limited in the application of LGA package. The socket 400 can help to facilitate mounting or dismounting an IC package on a system board, such as the motherboard. Also, the socket 400 could be the test socket for testing the performance of the package 402.

In FIG. 4, the socket 400 includes the flexible chassis assembly 404, the frame 406, the first hinged cover lid 408a, and the second hinged cover lid 408b, wherein the flexible chassis assembly 404 is the central part of the socket 400. The socket 400 for placing the package 402 is mounted on the PCB 403. The flexible chassis assembly 404 is for providing electrical contacts to the package 402 and transmission of electrical signals. The frame 406 is the casing of the socket 400. The first hinged cover lid 408a and the second hinged cover lid 408b are symmetrically situated on the frame 406, and both are pivoted on the socket 400. When the first hinged cover lid 408a and the second hinged cover lid 408b are pressed downward and snapped in place, the package 402 is retained properly and firmly in the socket. The frame 406, the hinged cover lids 408, several guide pins 512, and the flexible chassis assembly 404 can be assembled together to form the socket 400, before mounting on the PCB 403.

The socket 400 of the invention, as described above, can be mounted on the PCB 403 by the SMT (surface mount technologies) method. The replacement of the socket mounted by the SMT method is easier than the PTH (pin through hole) method if the socket is broken.

Figure 5A:
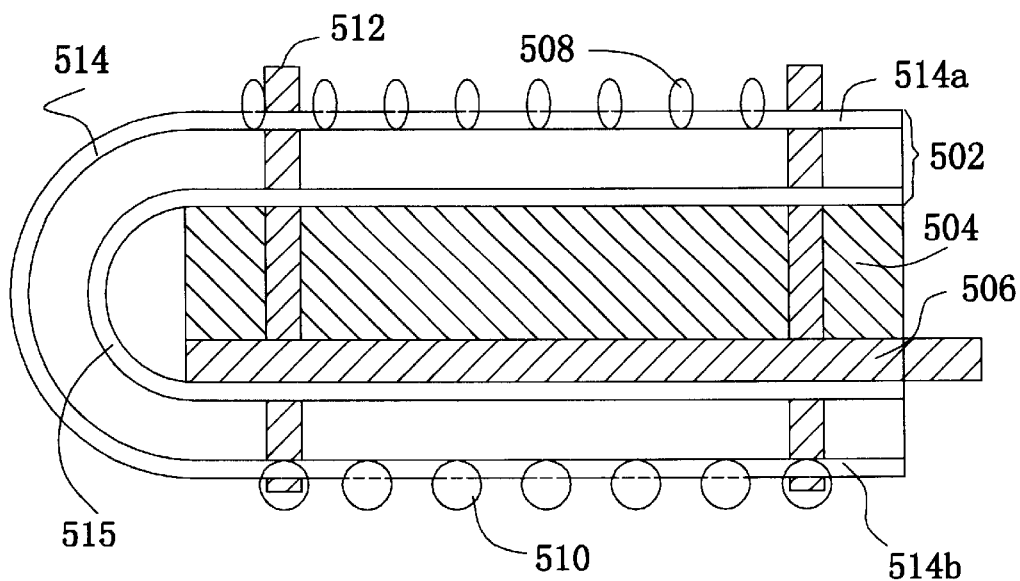
FIG. 5A is a cross-sectional view taken along line 5A—5A of FIG. 4 showing the flexible chassis assembly.

FIG. 5A is a cross-sectional view taken along line 5A—5A of FIG. 4 showing the flexible chassis assembly. The flexible chassis assembly 404 includes the flex-board 502, the silicone rubber pad 504, the inner base plate 506, a number of the conductive polymer bumps 508, the solder balls 510, and the guide pins 512. The flex-board 502 includes the two layers of solder masks 514 and 515. The silicone rubber pad 504, which serves as the cushion pad for the flex-board 502 wrapped around, can be substituted by the other elastic sheet materials. Furthermore, the solder masks 514 and 515 are used for protecting the inner compositions and structure of the flex-board 502, wherein for clarity purpose the solder mask 514 is renamed to be two suppositional parts- the first solder mask area 514a and the second solder mask area 514b.

Figure 5B:
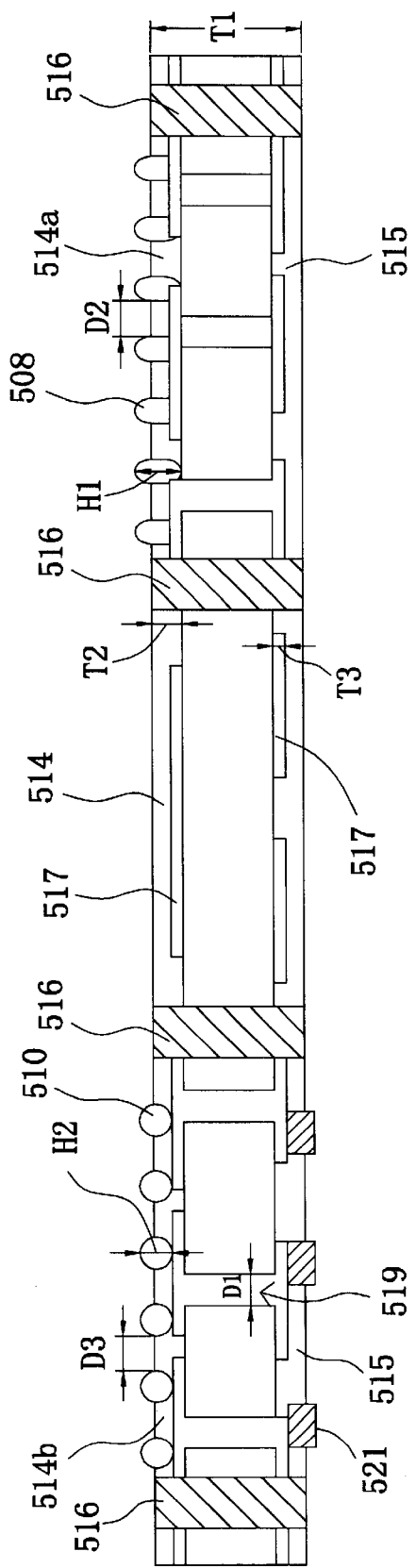
FIG. 5B is a side view of the unfolded flex-board removed from the flexible chassis assembly of FIG. 5A.
Figure 5C:
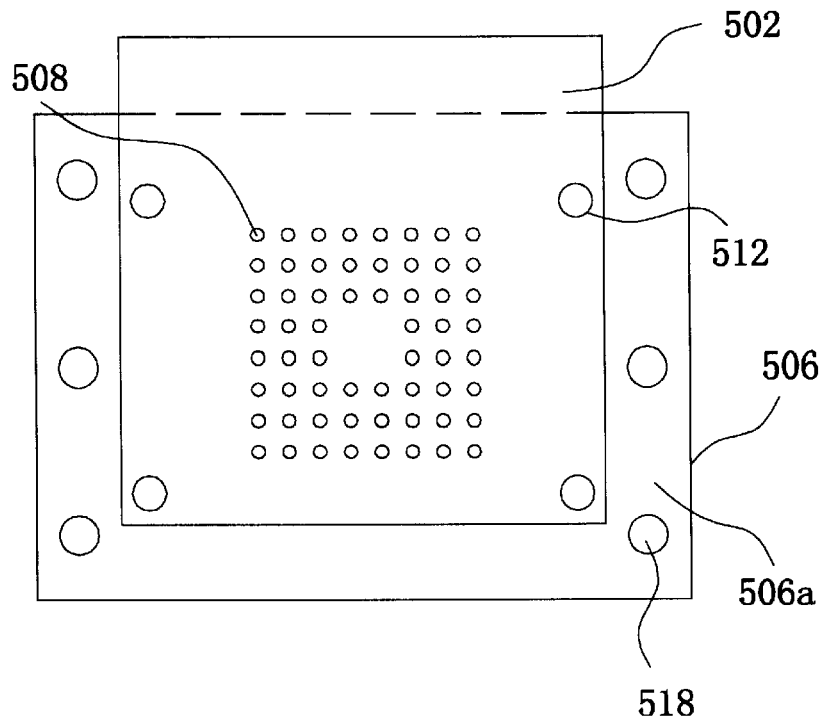
FIG. 5C is the top view of the flexible chassis assembly of FIG. 4.

FIG. 5B is a side view of the unfolded flex-board removed from the flexible chassis assembly of FIG. 5A. The flex-board 502 of FIG. 5A is now unfolded and numbered as 502a in FIG. 5B. The conductive polymer bumps 508 and the solder balls 510 are attached to the opening areas of the first solder mask area 514a and the second solder mask area 514b, respectively. The conductive polymer bumps 508 forms a matching array for the land pads on the LGA package (as shown in FIG. 5C). The surface of the conductive polymer bumps 508 are plated with a Au (gold) layer. (not shown) for the purpose of electrically connecting the conductive polymer bumps 508 and the package 402. The solder balls 510 also form an array and provide electrical connection to the PCB 403 after the surface mount, functionally similar to the conductive polymer bumps 508. The interconnect layer 517, such as Cu traces in one embodiment, are covered by the solder mask 514 and the solder mask 515. The vias 519 are built between the interconnect layer 517 and the solder masks 514 and 515. Moreover, the passive components 521 (such as capacitors or resistors) can be optionally attached to the flex-board 502a, usually on the side opposite to the solder balls side (the solder mask 515 of FIG. 5B), for the purpose of electrically connecting the interconnect layer 517 and circuit modification.

The relevant dimensions of FIG. 5B are described as follows. The thickness of the flex-board 502 (including the solder masks 514 and 515), Ti, typically ranges from 80 $\mu$m to 250 $\mu$m. The solder masks (solder resist) 514 and 515 usually have, the same thickness, and the thickness of each solder mask typically ranges from 5 $\mu$m to 25 $\mu$m. The thickness of the interconnect layer 517 typically ranges from 5 $\mu$m to 30 $\mu$m. The height of the conductive polymer bumps 508, H1, typically ranges from 200 $\mu$m to 700 $\mu$m. The height of the solder balls 510, H2, typically ranges from 300 $\mu$m to 700 $\mu$m. Additionally, the diameter of the via 519, D1, typically ranges from 30 $\mu$m to 150 $\mu$m. The pitch for the conductive polymer bumps 508, D2, could be 0.8 mm, 1.0 mm, 1.27 mm, or other convention. The pitch for the solder balls 510, D3, could be 0.8 mm, 1.0 mm, 1.27 mm, or other convention. Those dimensions are given as a typical range for conventions, and are not meant to be any limiting numbers in the invention.

The flex-board 502 also has multiple alignment holes 516. The guide pins 512 are inserted into and through the alignment holes 516 for assembling the flex-board 502 and the silicone rubber pad 504 together, as shown in FIG. 5A. In the preferred embodiment and drawings of the invention, four of the guide pins 512 and eight (four pairs) of the corresponding alignment holes 516 are demonstrated.

In FIG. 5A, the silicone rubber pad 504 is wrapped around and is encompassed by the flex-board 502, and serves as a compressive force mediator whenever the conductive polymer bumps on the flex-board 502 are pressed downward by contacting with the package 402. The silicone rubber pad 504 has four alignment holes correspondingly. The flex-board 502 is covered by the solder masks 514 and 515 for insulating and protecting the inner structure of the flex-board 502. The conductive polymer bumps 508 are attached to the first solder mask area 514a of the flex-board 502 while the solder balls 510 are attached to the second solder mask area 514b of the flex-board 502. The inner base plate 506 is beneath the silicone rubber pad 504 and is also wrapped around and encompassed by the flex-board 502. Other elastic sheet materials could substitute for the silicone rubber pad 504.

FIG. 5C is the top view of the flexible chassis assembly of FIG. 4. The guide pins 512 may be distinctively inserted on the inner base plate 506, or be an integral part of the inner base plate 506. In FIG. 5C, the guide pins 512 are inserted in the alignment holes 516 for fixing the flex board 502 and the inner base plate 506 at the right position. To assemble the flexible chassis assembly 404, the topside of the inner base plate 506 is first glued to the bottom side of the silicone rubber pad 504, while the inner side of the flex-board 502 is glued to the bottom side of the inner base plate 506 and the top side of the silicone rubber pad 504. In such a way the individual components of the flexible chassis assembly 404 are aligned, glued and assembled together.

One key point of the invention is that the guide pins 512 are not glued to the silicone rubber pad 504 and the flex-board 502, for the purpose of retaining elasticity of the flex-board 502 and the silicone rubber pad 504 whenever they are pressed by the package 402 or other external force. In this preferred embodiment, the silicone rubber pad 504 has four alignment holes (not shown), and those are arranged at the positions corresponding to the 4 pairs of the alignment holes 516 of the flex-board 502. In FIG. 5C, the width of the inner base plate 506 is larger than that of the flex-board 502, so that the tooling holes 518 could be formed on the extra periphery 506a for coupling to the socket frame 406. In this invention, six of the tooling holes 518 for assembling the socket frame are illustrated in FIG. 5C.

Figure 5D:
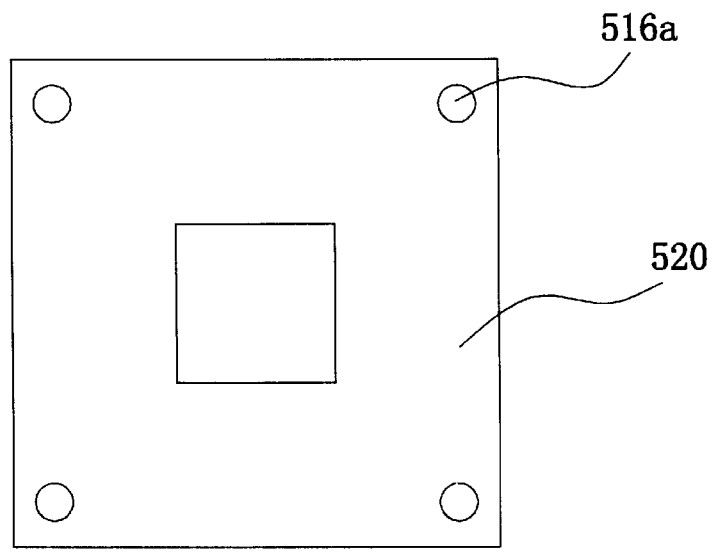
FIG. 5D is a top view of the package having 4 alignment holes on the corners.

FIG. 5D is a top view of the package having 4 alignment holes. In order to position the package 402 in the socket 400

Figure 5E:
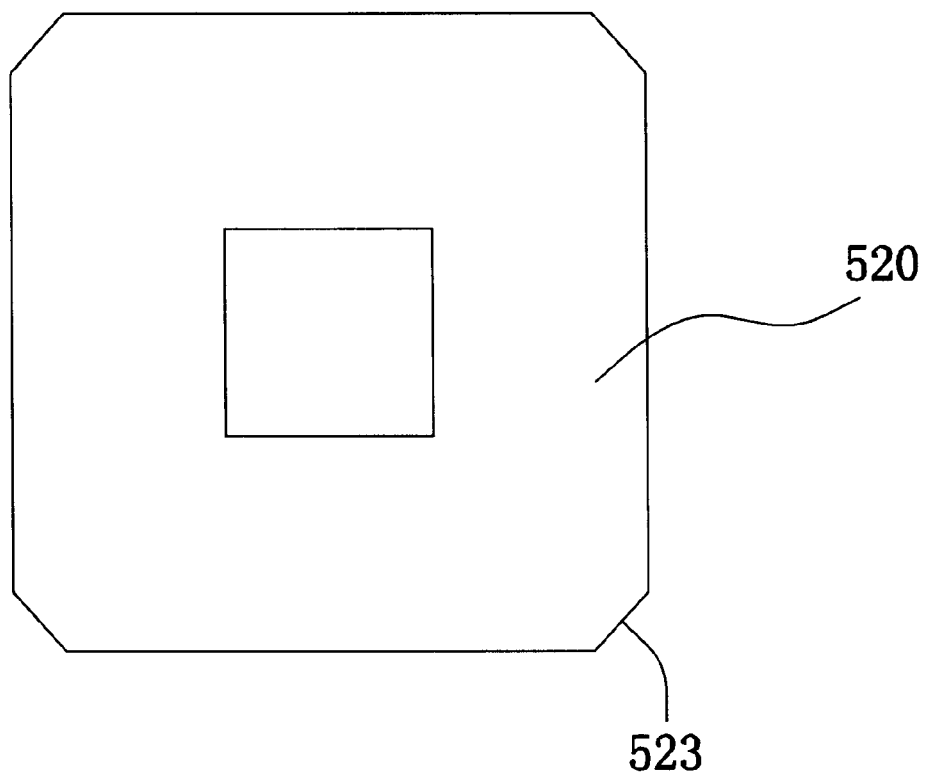
FIG. 5E is a top view of the package having 4 chamfers on the corners.

(FIG. 4) accurately and securely, the substrate 520 of the package 402 further has several alignment holes 516a, and the positions of the alignment holes 516a correspond to the position of the guide pins 512. When the package 402 is situated in the socket 400, the guide pins 512 on the flexible chassis assembly 404 are inserted into the alignment holes 516a of the package substrate 520. Although four of alignment holes 516a are taken for illustration in this embodiment, it will be understood by anyone skilled in the art that the invention can be modified under the spirit of fixing the package to the socket 400. For example, the chamfers 523 on the corners could replace the alignment holes 516a and stretch against the guide pins 512, as shown in FIG. 5E. As another embodiment, the alignment holes 516a and the chamfer 523 can be simultaneously used for the substrate 520 of the package 402.

Figure 6A:
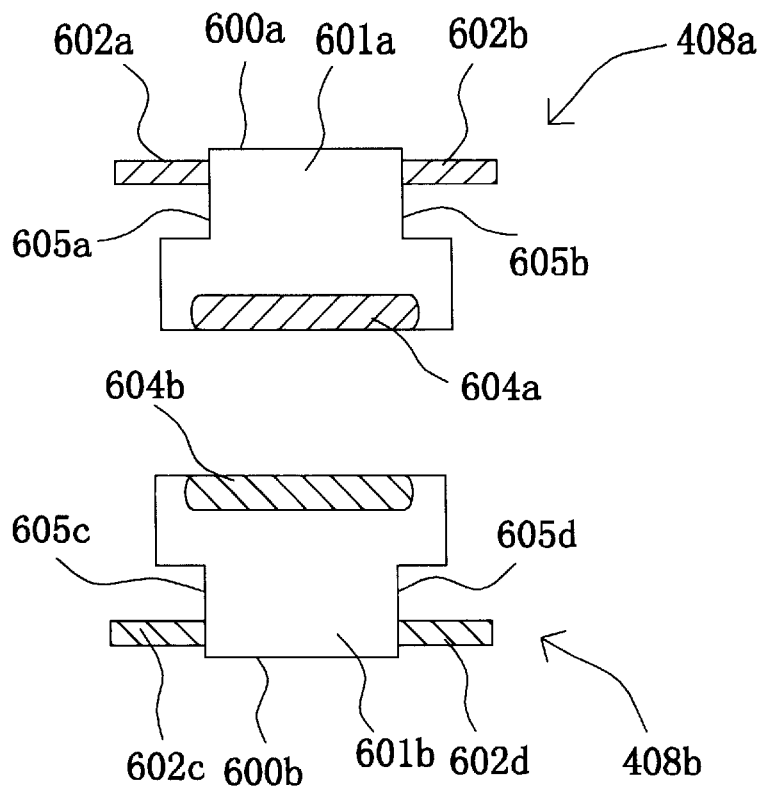
FIG. 6A is a plan view of the back surface of symmetrical hinged cover lids of FIG. 4.
Figure 6B:
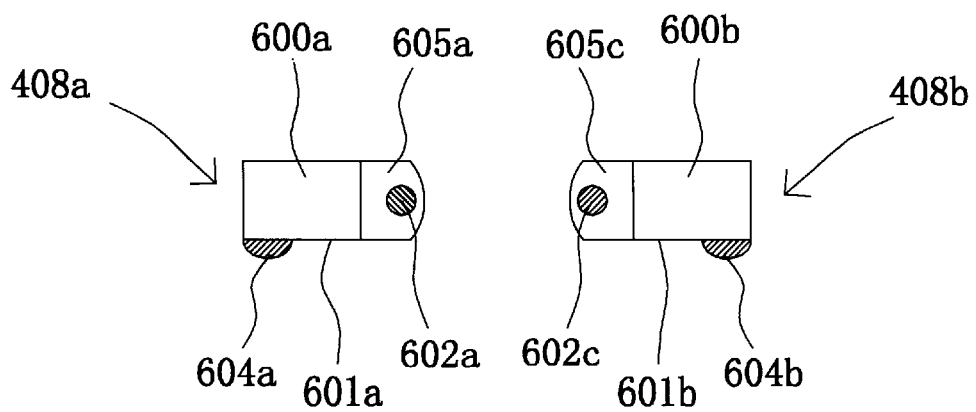
FIG. 6B is a cross-sectional view also taken along line 5A—5A of FIG. 4 showing a pair of the symmetrical hinged cover lids.

FIG. 6A is a plan view of the back surface of symmetrical hinged cover lids of FIG. 4. FIG. 6B is a cross-sectional view also taken along line 5A—5A of FIG. 4 showing a pair of symmetrical hinged cover lids. The first hinged cover lid 408a includes the first T-shaped plate 600a, the first hinge pin 602a, the second hinge pin 602b, and the first hinge pad 604a. The first hinge pin 602a and the second hinge pin 602b are formed on two sides 605a and 605b of the first T-shaped plate 600a, respectively. The first hinge pad 604a is formed on the back surface of the first T-shaped plate 600a. Also, the first hinge pin 602a, the second hinge pin 602b, and the first hinge pad 604a could be integral parts of the first T-shaped plate 600a.

Similarly, the second hinged cover lid 408b includes the second T-shaped plate 600b, the third hinge pin 602c, the fourth hinge pin 602d, and the second hinge pad 604b. The third hinge pin 602c and the fourth hinge pin 602d are formed on two sides 605c and 605d of the second T-shaped plate 600b, respectively. The second hinge pad 604b is formed on the back surface of the second T-shaped plate 600b. Also, the third hinge pin 602c, the fourth hinge pin 602d, and the second hinge pad 604b could be integral parts of the first T-shaped plate 600b.

A cross-sectional view of the symmetrical hinged cover lids taken along line 5A—5A in FIG. 4 is also shown in FIG. 6B. In FIG. 6B, the first hinge pad 604a and the second hinge pad 604b are built as a bump structure for the purpose of pressing the package 402. The first hinge pad 604a is on the back surface of the first T-shaped plate 600a, on the opposite side against the first hinge pin 602a. And the second hinge pad 604b is on the back surface of the second T-shaped plate 600b, on the opposite side against the second hinge pin 602b, respectively.

Figure 6C:
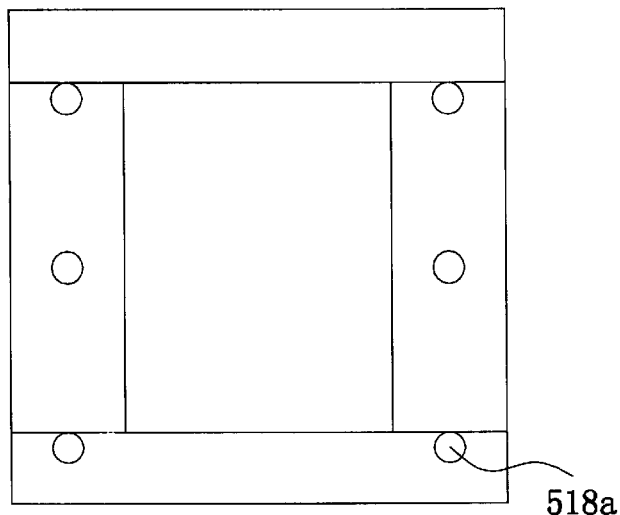
FIG. 6C is a top view of the frame of FIG. 4.

FIG. 6C is a top view of the frame of FIG. 4. The frame 406 has a number of tooling holes 518a, and the positions of tooling holes 518a match those of the tooling holes 518 on the inner base plate 506.

Figure 6D:
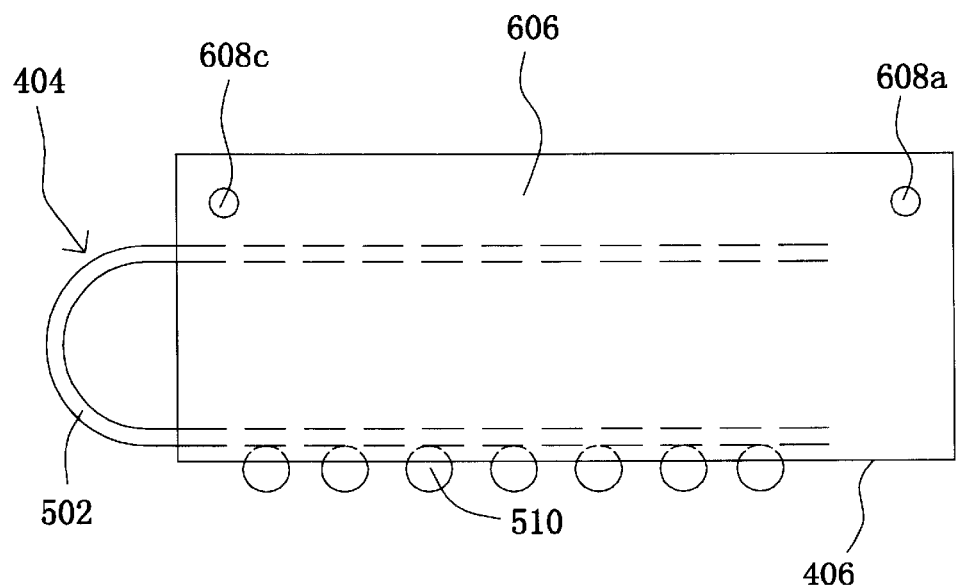
FIG. 6D is the cross-sectional drawing of the frame and the flexible chassis assembly of FIG. 4.

FIG. 6D is the cross-sectional drawing of the frame and the flexible chassis assembly of FIG. 4. In FIG. 6D, the first hinge hole 608a and the third hinge hole 608c are located at the top right corner and the top left corner of the surface 606 of the frame 406, respectively. On the surface (not shown in FIG. 6D) opposite to the surface 606, a second hinge hole (not shown in FIG. 6D) and a fourth hinge hole (not shown in FIG. 6D) are also located at positions parallel to the first hinge hole 608a and the third hinge hole 608c. During socket frame assembly, the first hinge pin 602a and the third hinge pin 602c are inserted into the first hinge hole 608a and the third hinge hole 608c, respectively. The second hinge pin 602b and the fourth hinge pin 602d are inserted into the second hinge hole and the fourth hinge hole, respectively. Moreover, the attached solder balls 510 are exposed and visible from the bottom view and side view of the frame 406.

In the description above, the first hinged cover lid 408a and the second hinged cover lid 408b can be firmly placed and be pivoting on the frame 406. When the first hinged cover lid 408a and the second hinged cover lid 408b are opened upward, the package 402 can be placed in the socket 400. Subsequently, the first hinged cover lid 408a and the second hinged cover lid 408b are pressed downward and snapped in place, the package 402 is then firmly positioned in the socket 400. Because the hinge cover lids merely touch part of the substrate 520 of the package 402, the package with pre-attached heat slug or heat sink can be situated in the socket 400 without problem, in which case the heat sink slug or heat doesn't obstruct the swing path of the hinge cover lids.

According to the aforementioned illustration, the socket structure for grid array (GA) packages of the invention has several benefits including:

(1) The socket of the invention, using the flexible chassis assembly instead of the expensive springy contact (such as pogo pins) or other compressive contact devices, reduces the primary cost.

(2) The socket of the invention, using two hinged cover lids for easy mounting and dismounting of the LGA/BGA packages, can easily host the package with pre-attached heat sink atop.

(3) The socket of the invention can be mounted on the PCB by SMT (surface mount technologies) method, and the socket is easily removed and replaced if broken.

While the invention has been described by ways of examples and in terms of the preferred embodiment, it is to be understood that the invention is not limited to the disclosed embodiment herein. On the contrary, it is intended to cover various modifications and similar re-arrangements and procedures, and the scope of the appended claims therefore should be accorded the broadest interpretation so as to encompass all similar modifications and re-arrangements and procedures.

What is claimed is:

1. A socket structure for grid array (GA) packages, mounted on a printed circuit board (PCB) for situating a package, comprising:
   a frame; and
   a flexible chassis assembly, situated inside the frame for electrically connecting the package and the PCB, comprising:
      a cushion pad;
      an inner base plate, underneath the cushion pad;
      a flex-board, for encompassing the cushion pad and the inner base plate;
      two solder mask layers, formed on a surface of the flex-board and having an interconnect layer thereunder;
      a plurality of bumps, formed on the topside of the flexible chassis assembly, and electrically connected to the package; and
      a plurality of solder balls, formed on the bottom side of the flexible chassis assembly, and electrically connected to the PCB.

2. The socket structure according to claim 1, wherein the surfaces of the bumps are plated with gold (Au), and the bumps form an array on the topside of the flexible chassis assembly.

3. The socket structure according to claim 1, wherein the solder balls form an array on the bottom of the flexible chassis assembly.

4. The socket structure according to claim 1, wherein the interconnect layer is formed of Cu traces.

5. The socket structure according to claim 1, wherein a plurality of passive components are attached to the solder mask opening for electrically connecting the interconnect layer.

6. The socket structure according to claim 1, wherein the socket mounted on a motherboard is for retaining a central processing unit (CPU).

7. The socket structure according to claim 1, wherein the socket is further used for testing the functions of the package.

8. The socket structure according to claim 1, wherein the bumps are conductive polymer bumps.

9. The socket structure according to claim 1, wherein the it cushion pad is a silicone rubber pad.

10. The socket structure according to claim 1, wherein the width of the inner base plate is larger than that of the flex-board.

11. The socket structure according to claim 1, wherein the inner base plate has a plurality of tooling holes.

12. A socket structure for grid array (GA) packages, mounted on a printed circuit board (PCB) for situating a package, comprising:
   a frame; and
   a flexible chassis assembly, situated inside the frame for electrically connecting the package and the PCB, comprising:
      a cushion pad;
      an inner base plate, underneath the cushion pad;
      a flex-board, for encompassing the cushion pad and the inner base plate;
      a plurality of first alignment holes, formed in the flex-board;
      a plurality of second alignment holes, formed in the cushion pad, at the positions to be aligned with the first alignment holes; and
      a plurality of guide pins, to be inserted into the first alignment holes and the second alignment holes, and fixed to the inner base plate.

13. The socket structure according to claim 12, wherein the guide pins are an integral part of the inner base plate.

14. The socket structure according to claim 12, wherein the package has a plurality of third alignment holes for receiving the guide pins.

15. The socket structure according to claim 12, wherein the cushion pad is a silicone rubber pad.

16. The socket structure according to claim 12, wherein the width of the inner base plate is larger than that of the flex-board.

17. The socket structure according to claim 12, wherein the inner base plate has a plurality of tooling holes.

18. The socket structure according to claim 12, wherein the flexible chassis assembly further comprises:
   two solder mask layers, formed on a surface of the flex-board and having a interconnect layer there under;
   a plurality of bumps, formed on the topside of the flexible chassis assembly and electrically connected to the package; and
   a plurality of solder balls, formed on the bottom side of the flexible chassis assembly and electrically connected to the PCB.

19. The socket structure according to claim 12, wherein the guide pins are an integral part of the inner base plate.

20. The socket structure according to claim 12, wherein the package has a plurality of third alignment holes for receiving the guide pins.

21. The socket structure according to claim 12, wherein the socket mounted on a motherboard is for retaining a central processing unit (CPU).

22. The socket structure according to claim 12, wherein the socket is further used for testing the functions of the package.

23. The socket structure according to claim 18, wherein a plurality of passive components are attached to the solder mask opening for electrically connecting the interconnect layer.

24. The socket structure according to claim 20, wherein the package has a plurality of chamfers with proper dimension to fit into the positions of the guide pins.

* * * * *